(12) United States Patent
Rubinstein et al.

(10) Patent No.: US 7,378,287 B2
(45) Date of Patent: May 27, 2008

(54) WAFER MATCHING METHODS FOR USE IN ASSEMBLING MICROMIRROR ARRAY DEVICES

(75) Inventors: Y. Dan Rubinstein, Mountain View, CA (US); Anoop Singhal, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 500 days.

(21) Appl. No.: 10/875,987

(22) Filed: Jun. 23, 2004

(65) Prior Publication Data

US 2005/0287694 A1    Dec. 29, 2005

(51) Int. Cl.
    *H01L 21/00* (2006.01)
(52) U.S. Cl. .................................. 438/6; 257/E21.499
(58) Field of Classification Search .................... 438/6, 438/10, 104, 107–114, 118, 121–123, 128, 438/129, 135, 142, 145, 149, 151, 157
    See application file for complete search history.

(56) References Cited

U.S. PATENT DOCUMENTS

| 5,835,256 | A | 11/1998 | Huibers |
| 6,046,840 | A | 4/2000 | Huibers |
| 6,088,474 | A | 7/2000 | Dudasko et al. |
| 6,624,921 | B1 * | 9/2003 | Glenn et al. ............... 359/291 |
| 2002/0132389 | A1 | 9/2002 | Patel et al. |
| 2003/0008477 | A1 | 1/2003 | Kang et al. |
| 2003/0054588 | A1 | 3/2003 | Patel et al. |
| 2003/0223084 | A1 | 12/2003 | Mehri et al. |
| 2004/0042000 | A1 | 3/2004 | Mehri et al. |
| 2004/0087043 | A1 * | 5/2004 | Lee et al. ...................... 438/6 |
| 2004/0125346 | A1 | 7/2004 | Huibers |
| 2005/0074919 | A1 | 4/2005 | Patel |
| 2005/0233498 | A1 * | 10/2005 | Kocian et al. .............. 438/116 |

OTHER PUBLICATIONS

Henry Chu, et al., "DMD superstructure Characterizations", Jul.-Sep. 1998, pp. 75-86.
W.N. Sharpe, et al. "Tensile testing of MEMS materials-recent progress". Journal of Materials Science 38 (2003), pp. 4075-4079.
T.E. Buchheit, et al., "Micromechanical testing of MEMS materials", Journal of Materials Science 38 (2003), pp. 4081-4086.
S.M. Allameh, et al., "An introduction to mechanical-properties-related issues in MEMS structures", Journal of Materials Science 38 (2003), pp. 4115-4123.

(Continued)

*Primary Examiner*—Michael Lebentritt
*Assistant Examiner*—Andre Stevenson
(74) *Attorney, Agent, or Firm*—Wade James Brady, III; Frederick J. Telecky, Jr.

(57) ABSTRACT

The invention provides a method for matching micromirror wafers and electrode wafers so as to form micromirror array devices while the production yield is maximized. Each micromirror wafer and/or electrode wafer may have one or more non-passing dies and a plurality of good dies. A set of matching schemes are defined for matching each micromirror wafer with an electrode wafer. For each matching scheme, a cost is calculated with the cost being defined as a total number of unmatched die assemblies resulted from the matching scheme, wherein the unmatched die assembly is defined as an assembly consisting of a passing and non-passing die. Then a matching scheme is selected from the defined matching scheme such that the calculated cost is the minimum among the calculated costs of the defined matching schemes.

28 Claims, 6 Drawing Sheets

OTHER PUBLICATIONS

S.M. Allameh, et al., Surface topography evolution and fatigue fracture of polysilicon, Journal of Materials Science 38 (2003), pp. 4145-4155.

Ken Gall, et al., "Thermomechanical response of bare and $Al_2O_3$—nanocoated Au/Si bilayer beams for micromechanical systems", J. Mater. Res., vol. 18, No. 7, Jul. 2003, pp. 1575-1587.

* cited by examiner

WAFER MATCHING METHODS FOR USE IN ASSEMBLING MICROMIRROR ARRAY DEVICES

TECHNICAL FIELD OF THE INVENTION

The present invention relates to the art of microelectromechanical devices, and more particularly to wafer matching methods used in assembling micromirror array devices, each of which comprises two separate wafers.

BACKGROUND OF THE INVENTION

Microelectromechanical (MEMS) devices have found many applications in basic signal transductions. For example, MEMS-based spatial light modulators are transducers that modulate incident light in a spatial pattern in response to optical or electrical inputs. The incident light may be modulated in phase, intensity, polarization, or direction. This modulation may be accomplished through the use of a variety of materials exhibiting magneto-optic, electro-optic, or elastic properties. Such spatial light modulators have many applications, including optical information processing, display systems, and electrostatic printing.

A micromirror-based spatial light modulator is a spatial light modulator consists of an array of micromirrors and an array of electrodes and circuits. A typical micromirror has a deformable reflective mirror plate attached to a deformable hinge that is held on a substrate such that the mirror plate can rotate to different positions. According to the different rotation positions of the mirror plate, operation states, such as ON and OFF states in a binary operation mode are defined. In the ON state, incident light is reflected so as to produce a "bright" pixel on a display target, and in the OFF state, incident light is reflected to produce a "dark" pixel on the display target. In an application of displaying an image represented by image pixels having "bright" and "dark" values, the micromirrors are associated with the image pixels, and the micromirrors are individually set to the ON or OFF states according to the "bright" or "dark" values of the image pixels associated with micromirrors. The collective effect of the reflection from the micromirrors at the ON and OFF states for a given incident light is reproduction of the image on the display target.

The deflections of the mirror plates are accomplished through the electrodes and circuits connected to the electrodes. Specifically, each mirror plate of a micromirror is electrostatically coupled to one or more electrodes such that an electrostatic field can be established between the mirror plate and the electrode(s) for deflecting the mirror plate. The strength of the electrostatic field is determined by the voltage of the electrode, and voltage of the electrode is controlled by the output voltage of the circuit, which can be a memory cell, such as a DRAM. With this configuration, the micromirrors can thus be individually addressed and the mirror plates of the micromirrors can be individually deflected.

Currently, a variety of micromirror-based spatial light modulators have been developed. For example, a spatial light modulator may have the micromirrors and electrodes formed on separate substrates. In particular, the micromirrors are formed on a light transmissive substrate, while the electrodes and circuitry are formed on a standard semiconductor substrate. An advantage of this configuration is that the micromirrors can be fabricated on the light transmissive substrate using a separate fabrication process from the process for fabricating the electrodes and circuitry on the semiconductor substrate. Therefore, most suitable fabrication processes can be respectively designed for the micromirrors and the electrodes and circuitry. After separate fabrications of the micromirrors and electrodes and circuitry, the substrates are assembled together to form a micromirror array device.

In industrial manufacturing, the micromirrors are fabricated in dies on a light transmissive wafer with each die comprising an array of micromirrors. Likewise, the electrodes and circuitry are also formed in dies on a semiconductor wafer with each die having an array of electrodes and circuitry. After the fabrications of the micromirrors and electrodes, the micromirror dies and the electrode dies can be assembled on the wafer level. The assembled micromirror dies and electrode dies on the assembled wafers are then separated into individual die assemblies. Such a wafer-level assembling method, however, raises a die matching problem in a situation that not all dies on a wafer are passing dies.

Often times, not all the dies on a wafer (e.g. the micromirror wafer and the electrode wafer) are passing dies, such as the dies satisfying pre-determined product quality and performance requirements. Moreover, locations of the passing (or non-passing) dies on wafers vary from wafer to wafer. As a result, a passing die on one wafer may be assembled with a non-passing die on another wafer, resulting in reduction of the production yield.

Therefore, what is desired is a die matching mechanism for matching the dies on different wafers while maximize the production yield.

SUMMARY OF THE INVENTION

The objects and advantages of the present invention will be obvious, and in part appear hereafter and are accomplished by the present invention that provides a method and apparatus for operating pixels of spatial light modulators in display systems. Such objects of the invention are achieved in the features of the independent claims attached hereto. Preferred embodiments are characterized in the dependent claims. In the claims, only elements denoted by the words "means for" are intended to be interpreted as means plus function claims under 35 U.S.C. § 112, the sixth paragraph.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

FIG. 4b illustrates an exemplary micromirror in FIG. 4a;

DETAILED DESCRIPTION OF EXEMPLARY EMBODIMENTS

The invention provides a method for matching micromirror wafers and electrode wafers so as to form micromirror array devices while the production yield is maximized. In an embodiment of the invention, a method of forming a plurality of microelectromechanical devices is disclosed. The method comprises: providing a first and second set of wafers, each wafer having a component of the microelectromechanical device; inspecting the quality of each wafer from the first and second set of wafers; and matching a wafer from the first set of wafers with a wafer in the second wafer set based on the inspection.

The dies on wafers, including micromirror dies on micromirror wafers and electrode dies on electrode wafers are evaluated after fabrications. The evaluation identifies the locations of the non-passing and passing dies on each wafer. According to the location information, a wafer of one kind (e.g. micromirror wafer or electrode wafer) is selected to match another wafer of another kind (e.g. electrode wafer or micromirror wafer) such that the production yield is maximized. The production yield can be measured in terms of the total number of passing die assemblies or the total number of non-passing die assemblies. A good die assembly is an assembly wherein both dies of the assembly are passing dies, or are non-passing dies; and a non-passing die assembly comprises a "bad" die and a passing die. For example, when a passing micromirror die (or electrode die) is assembled with a non-passing electrode (or micromirror die), such a die assembly is a non-passing die assembly. When the total number of passing die assemblies is maximized, or equivalently, the total number of non-passing die assemblies is minimized, the production yield is maximized. By "wafer" it is meant any substrate on which die areas, e.g. multiple circuits or microelectromechanical device areas (for example, micromirrors or micromirror arrays) are to be formed and which allows for being divided into dies. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6" or 12" in diameter) so as to allow for manufacture in a standard foundry.

For simplicity and demonstration purposes only, the present invention will be discussed with reference to a micromirror array device, such as a spatial light modulator having an array of micromirrors, each of which has a deflectable reflective mirror plate. Those skilled in the art will certainly appreciate that the following examples are not be interpreted as a limitation. Rather, other variations within the spirit of the invention are also applicable.

Figure 1:
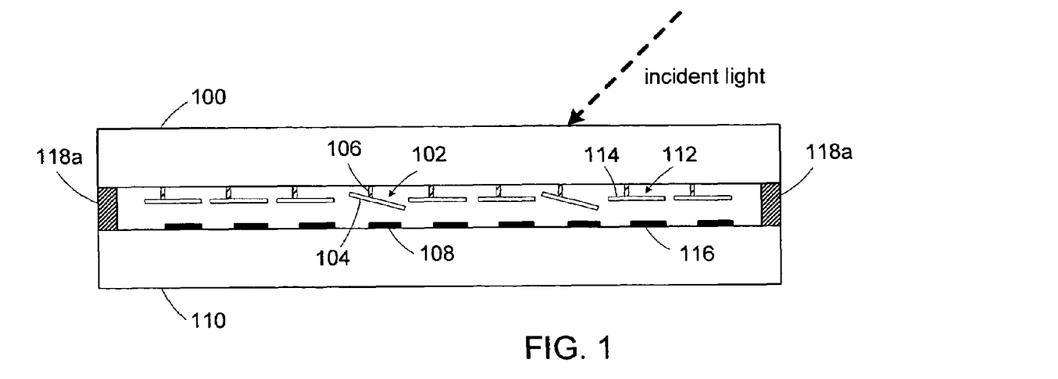
FIG. 1 is a cross-sectional view of a micromirror array device.

Turning to the drawings, FIG. 1 illustrates a cross-sectional view of a micromirror array device in which embodiment of the invention can be implemented. The micromirror array device in this example comprises two substrates, substrate 100, and substrate 110. Substrate 100, which is a light transmissive substrate, such as glass has an array of micromirrors (e.g. micromirrors 102 and 112). Each micromirror has a deflectable reflective mirror plate, such as mirror plates 104 and 114 of micromirror 102 and 112, respectively. Each mirror plate is attached to a hinge (e.g. mirror plate 106 is attached and held by hinge 106) such that the mirror plate can rotate relative the substrate of the micromirror.

For individually addressing and deflecting the mirror plates of the micromirrors, an array of electrodes is provided and associated with the micromirrors. For example, electrodes 108 and 116 are respectively associated with micromirrors 102 and 112. The electrode array is formed on substrate 110, which can be a standard semiconductor substrate. Substrate 110 is placed approximate to substrate 100 such that electrostatic fields can be established between individual mirror plates and electrodes, and the mirror plates can be rotated with such electrostatic fields. The distance between substrates 110 and 100 can be maintained by spacer 118a and 118b, or by other alternative ways, such as in-array pillars, as set forth in U.S. patent application Ser. No. 10/875,987 "Micromirror Array Assembly with In-array Pillars" to Patel, the subject matter being incorporated herein by reference.

Figures 2A, 2B:
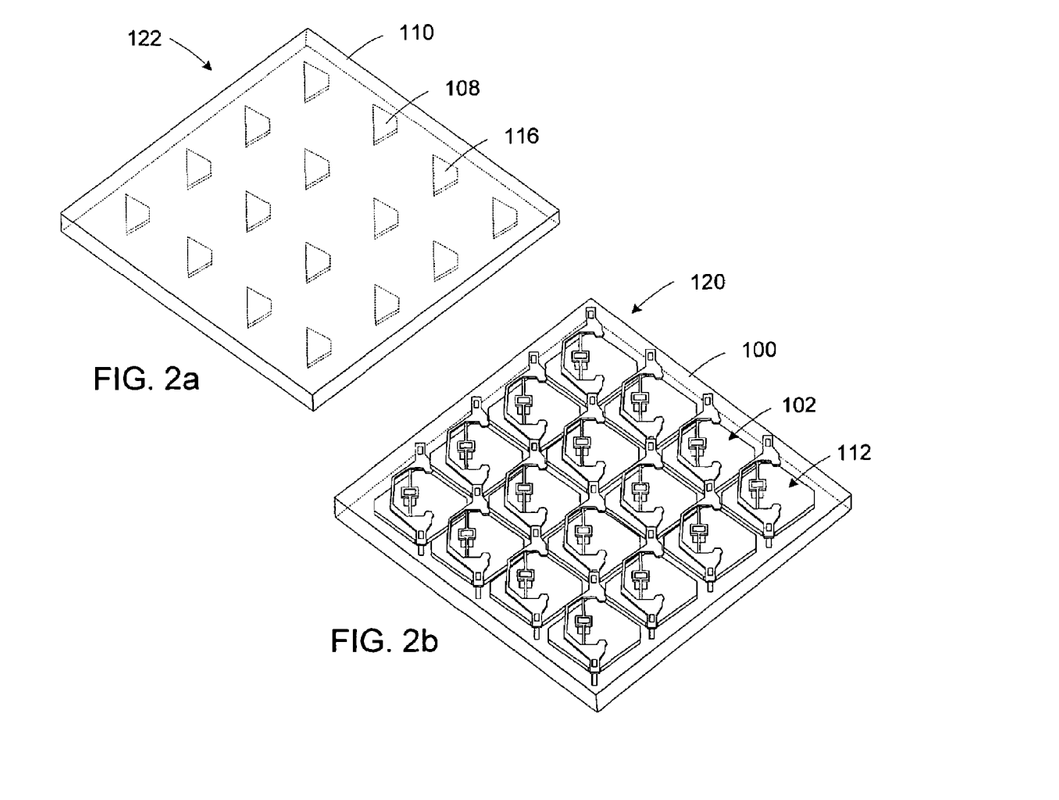
FIG. 2a is a perspective view of a portion of an electrode array on a semiconductor wafer.
FIG. 2b is a perspective view of an array of micromirrors on a light transmissive substrate.

FIG. 2a and FIG. 2b demonstratively illustrates perspective views of the micromirror array and electrode array on substrates. Referring to FIG. 2a, an array of electrodes (e.g. electrodes 108 and 116), is formed on the semiconductor substrate 110. As shown in FIG. 2b, the array of micromirrors (e.g. such as micromirror 102 and 112) is formed on light transmissive substrate 100.

The micromirrors and the electrodes are formed separately with different fabrication processes. For example, the electrodes and circuitry on the semiconductor wafer can be fabricated with a standard integrated circuit fabrication technique, while the micromirrors on the light transmissive substrate can be fabricated using a method as set forth in U.S. patent applications Ser. No. 10/366,296 to Patel, filed on Feb. 12, 2003, Ser. No. 10/366,297 to Patel, field on Feb. 12, 2003, Ser. No. 10/402,789 to Patel, field on Mar. 28, 2003, Ser. No. 10/402,889 to Patel, field on Mar. 28, 2003, Ser. No. 10/627,155 to Patel, fined on Jul. 24, 2003, Ser. No. 10/613,379 to Patel, filed on Jul. 3, 2003, Ser. No. 10/437,776 to Patel, filed on May 13, 2003, and Ser. No. 10/698,513 to Patel, field on Oct. 30, 2003, the subject matter of each being incorporated herein by reference. The micromirrors and electrodes can be fabricated in dies on wafers with each die comprising a micromirror array or an electrode array, as shown in FIGS. 3a and 3b.

Figure 3A:
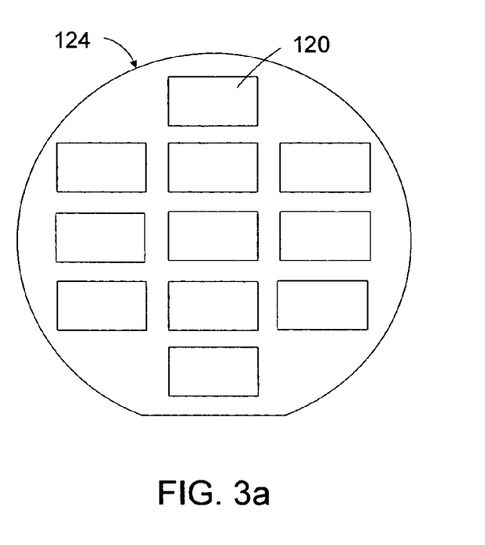
FIG. 3a schematically illustrates a plurality of micromirror dies on a micromirror wafer, each such die having an array of micromirrors.
Figure 3B:
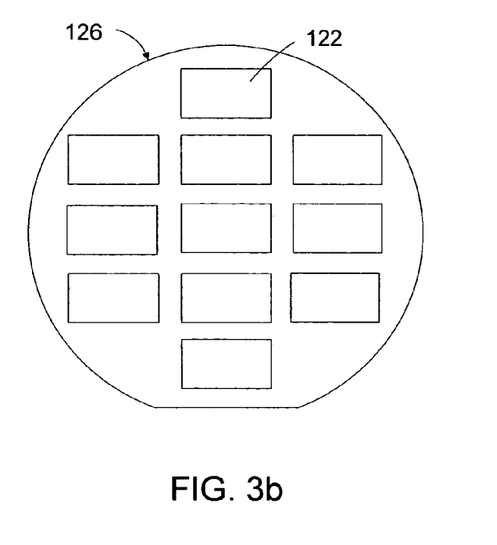
FIG. 3b schematically illustrates a plurality of electrode dies on an electrode wafer, each such die having an array of electrodes.
Figure 3C:
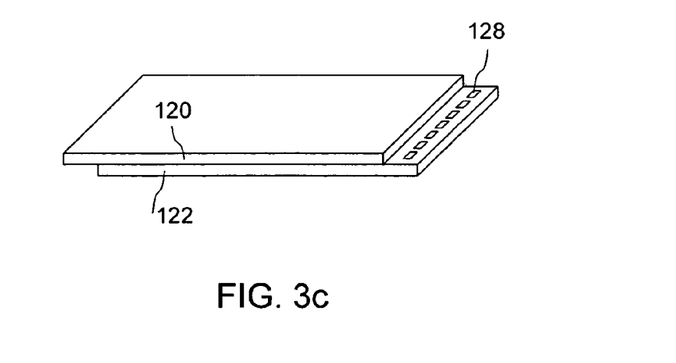
FIG. 3c illustrates a micromirror assembly after the wafer in FIGS. 3a and 3b are assembled and broken into assemblies.

Referring to FIG. 3a, a plurality of micromirror dies (e.g. micromirror die 120) each comprising an array of micromirrors, are fabricated on micromirror wafer 124, which is a light transmissive substrate, such as glass. Likewise, a plurality of electrode dies, such as electrode die 122, is formed on electrode wafer 126, which is a standard semiconductor wafer, as shown in FIG. 3b. After the fabrications of the micromirror dies on the micromirror wafer and the electrode dies on the electrode wafer, the micromirror dies are assembled with the electrode dies to form die assemblies on the wafer-level by aligning and assembling the two wafers, followed by the die assemblies being separated from each other (further details of wafer assembling, bonding and separating are set forth in U.S. patent application Ser. No. 10/366,296, the subject matter being incorporated herein by reference), with one of which being illustrated in FIG. 3c. Referring to FIG. 3c, the light transmissive substrate 120 having an array of micromirrors formed thereon is bonded to the semiconductor substrate 122 having the array of electrodes. Electric pads 128 are provided for applying voltages to the micromirrors.

Figure 4A:
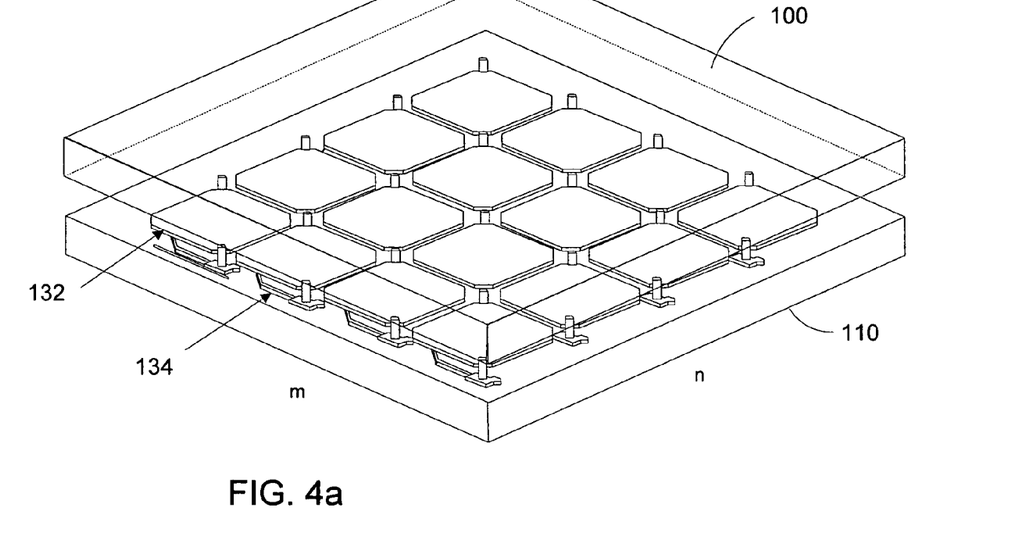
FIG. 4a is a perspective view of the micromirror assembly in FIG. 3c.

FIG. 4a illustrates a perspective view of a separated micromirror assembly. As shown in FIG. 4a, light transmissive substrate 100 having micromirror array 132 is bonded to the semiconductor substrate 110 having electrode array 134 such that the micromirror array can be electrostatically coupled to the electrode array.

The micromirrors of the micromirror array operate in binary-mode, that is, the mirror plates of the micromirrors switch between an ON and OFF state in performing the light modulation. In the ON state, the mirror plate of the micromirror reflects incident light so as to generate a "bright" pixel on a display target; and in the OFF state, the mirror plate reflects the incident light so as to generate a "dark" pixel on the display target. The more often the micromirror is in the ON state, the brighter the corresponding displayed pixel in a viewed image. In a number of embodiments of the invention, the micromirror array is constructed having a pitch (the center-to-center distance between adjacent micromirrors) of 25 micrometers or less, or 10.16 micrometers or less, or from 4.38 to 10.16 micrometers. The gap between adjacent micromirrors is approximately of 0.5 micrometers or less, or from 0.1 to 0.5 micrometer. And the mirror plate of the micromirror has a dimension of from 20 micrometers to 10 micrometers.

For simplicity purposes, only 4×4 micromirrors are illustrated in the figure. Oftentimes, the micromirror array device has more micromirrors. For example, when the micromirror array device is a portion of a spatial light modulator of a display system, it may have millions of micromirrors, the number of which determines the resolution of the display system. For example, the spatial light modulator may have a resolution of 1024×768 or higher, or 1280×1024 or higher, or 1640×1280 or higher. Of course, the micromirror array device may have a fewer number of micromirrors than in display, or other applications.

Figure 4B:
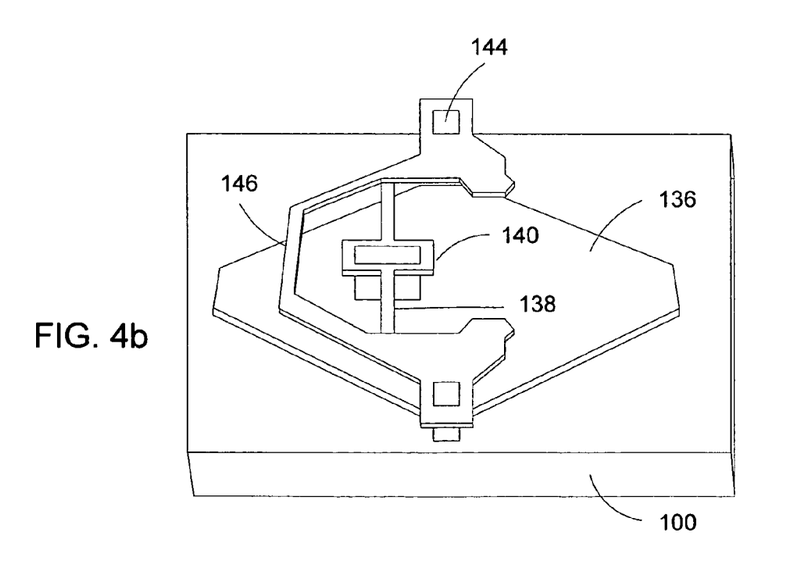

For demonstration purposes, FIG. 4b illustrates an exemplary micromirror. In this example, the micromirror has mirror plate 136 attached to hinge 138 through hinge contact 140. The hinge in this example can be a torsion hinge. The hinge is held by hinge structure 146 that is held on light transmissive substrate 100 by posts 144. As shown in the figure, the mirror plate and the hinge are on different planes. And the mirror plate is located between the hinge and the substrate such that the hinge is "hidden" from the light beam incident onto the mirror plate. This configuration has many benefits, such as minimization of light scattering from the hinge, which may degrade the contrast ratio of the displayed images. Of course, other type of configurations can also be used.

Figure 5A:
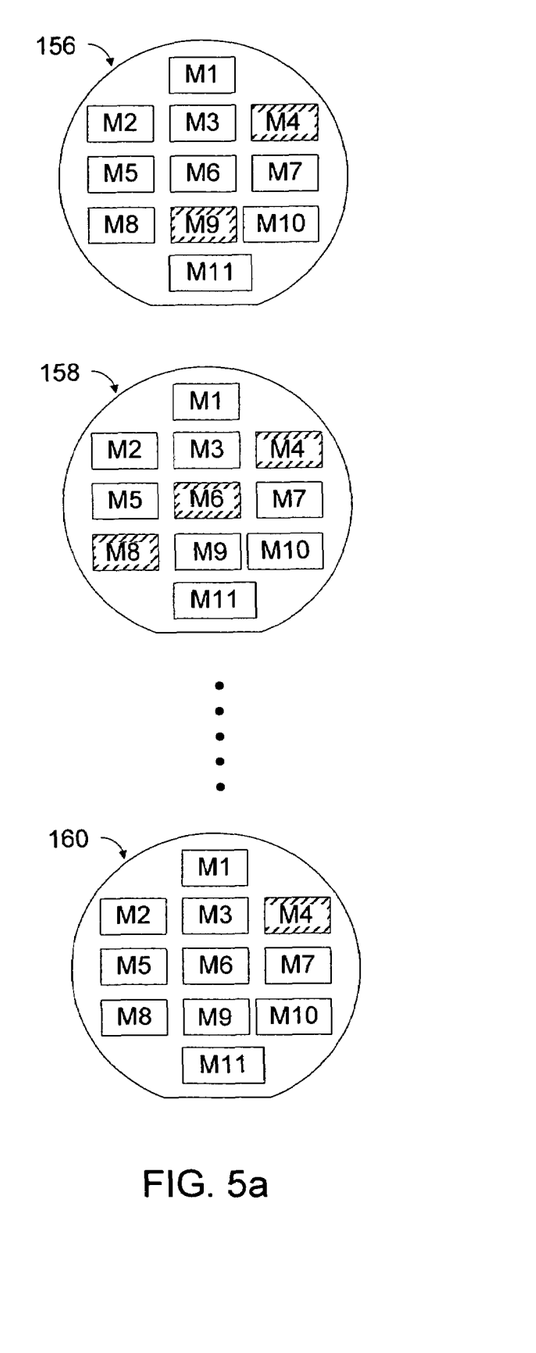
FIG. 5a illustrates a set of micromirror wafers to be assembled.
Figure 5B:
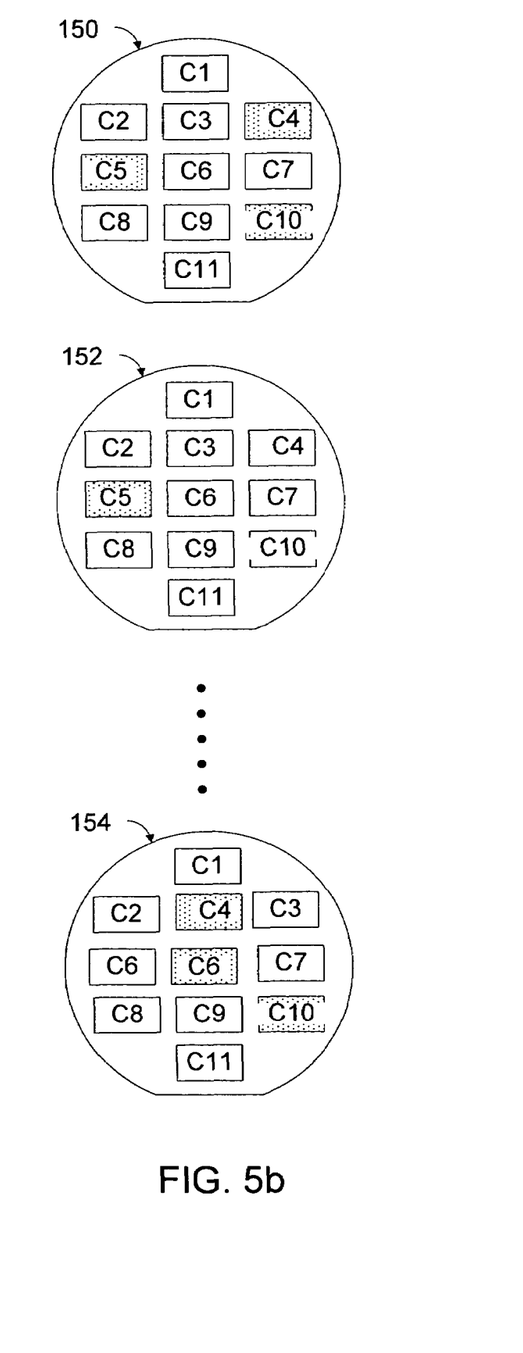
FIG. 5b illustrates a set of electrode wafers to be assembled.

As discussed above with reference to FIGS. 3a and 3b, the micromirrors and electrodes are fabricated in dies on wafers. In a typical industrial manufacture, many micromirror wafers and electrode wafers are fabricated before being assembled, as shown in FIGS. 5a and 5b. Referring to FIG. 5a, micromirror wafers 150, 152 and 154 and many other micromirror wafers are fabricated. Each of such micromirror wafers has multiple micromirror dies formed thereon. The micromirror dies on each micromirror wafer are labeled to identify their locations. For example, the dies on a micromirror wafer are labeled from M1 through M11. Not all micromirror dies, however, are passing dies, as those represented by blank squares. In particular, one or more micromirror dies on a wafer may be non-passing dies, as those represented by shaded squares. The passing and non-passing dies are determined by their quality and performance evaluations by any suitable method, as set forth in U.S. patent application Ser. No. 10/875,602 "A Method and Apparatus for Qualitatively Analyzing Uniformity in Microelectromechanical Devices", and U.S. patent application Ser. No. 10/875,555 "A method and Apparatus for Qualitatively Analyzing Uniformity in Microelectromechanical Devices", both are filed on the same day as the current patent application, the subject of each being incorporated herein by reference. Moreover, the passing and non-passing dies may have different locations on different wafers. For example, on wafer 156, dies M4 and M9 are "bad die, while the rest dies are passing dies. On wafer 158, dies M4, M6, and M8 are non-passing dies, and the remaining dies are passing micromirror dies.

Likewise, the electrode dies on the electrode wafers are also labeled to identify their respective locations. In particular, the dies on an electrode wafer are labeled with C1 through C11. The passing electrode dies are illustrated as blank squares, while the non-passing electrode dies are illustrated in shaded squares. The same as the micromirror dies, the passing and non-passing electrode dies may be randomly distributed across a wafer, and the locations of the non-passing and passing dies vary from wafer to wafer. For example, on wafer 152, dies C5 is a non-passing die, while the rest dies are passing dies. On wafer 154, dies C4, C6, and C10 are non-passing dies, and the rest of the dies are passing micromirror dies.

In assembling the micromirror and electrode wafers, it is certainly desired that the passing dies are matched with and assembled to the passing dies, and so do the non-passing dies. In this way, the production yield can be maximized. However, due to the existence and random locations of the non-passing die(s) on each wafer, a passing die may be matched to and assembled with a non-passing die. For example, when micromirror wafer 156 in FIG. 5a is matched to and assembled with electrode wafer 150 in FIG. 5b, matched dies pairs (M1,C1), (M2,C2), (M3,C3), (M6,C6), (M7,C7), (M8,C8), and (M11,C11) are passing die assemblies, because the passing dies are paired together. Even though dies M4 and C4 are bad dies, and the die assembly of (M4, C4) is a non-passing die assembly, such matching is still cost-effective because no passing dies are wasted. The matching pairs (M5,C5), (M9,C9), and (M10,C10), however, are bad matching pairs because each of such pairs comprises a passing die and the passing dies are then wasted after assembly. For quantitatively evaluating the die matching, a parameter of "cost" is defined. The value of cost in a die matching scheme equals the total unmatched dies, wherein an unmatched die is defined as an assembly having a passing and non-passing dies. In the above example of matching micromirror wafer 156 with electrode wafer 150, the cost of such matching scheme is three (3)—the total number of unmatched die assemblies including die pairs (M5,C5), (M9,C9), and (M10,C10).

When only one wafer of a different kind is provided for a given wafer, for example, when only electrode wafer 150 is provided for micromirror wafer 156, the wafers are matched and assembled. The cost of such match is determined by the total number of unmatched die assemblies after such matching and assembly. When a set of wafers of different kind is provided for a given wafer, a wafer of different kind is selected from the wafer set for matching the given wafer such that the cost is minimized. For example, a set of electrode wafers including wafers 150, 152, and 154 are provided for micromirror wafer 156. The cost of each matching scheme of the micromirror wafer to each one of the electrode wafers in the set is calculated and compared. The matching scheme corresponding to the least cost is then selected. The costs of the individual matching schemes are listed in Table 1 in the following. It can be seen from Table 1 that, micromirror wafer 156 is preferably matched to either electrode wafer 150 or 152 due to the least cost.

TABLE 1

| | Electrode wafer 150 | Electrode wafer 152 | Electrode wafer 154 |
|---|---|---|---|
| Cost | 3 | 3 | 5 |

When a set of wafers is to be matched and assembled to another set of wafers, such as a set of micromirror wafers are to be matched to and assembled with a set of electrode wafers, the cost of a matching scheme is determined by the total number of unmatched die assemblies resulted from such matching scheme. The costs of each matching scheme is then calculated and compared with other matching schemes so as to determine a matching scheme that results in the lest cost. As a way of example, an electrode wafer set including electrode wafers 150, 152, and 154 is provided and to be matched to a micromirror set including micromirror wafers 156, 158, and 160. The cost of any two wafers selected from different wafer sets is presented in Table 2.

TABLE 2

| | micromirror wafer 156 | micromirror wafer 158 | micromirror wafer 160 |
|---|---|---|---|
| electrode wafer 150 | 3 | 3 | 2 |
| electrode wafer 152 | 3 | 4 | 2 |
| electrode wafer 154 | 5 | 4 | 4 |

Based on table 2, the costs of different matching schemes can be calculated which are presented in table 3. The cost of each matching scheme is a summation of the costs of each matched die pairs of the scheme. It can be seen that schemes 2 and 6 have the least cost as compared to other schemes. Therefore, scheme 2 or scheme 6 can be selected for matching the wafers so as to maximize the production yield.

TABLE 3

| | matched die pairs of the scheme | COST |
|---|---|---|
| scheme 1 | (156, 150), (158, 152), (160, 154) | 11 |
| scheme 2 | (156, 150), (158, 154), (160, 152) | 9 |
| scheme 3 | (156, 154), (158, 150), (160, 152) | 10 |
| scheme 4 | (156, 154), (158, 152), (160, 150) | 11 |
| scheme 5 | (156, 152), (158, 150), (160, 154) | 10 |
| scheme 6 | (156, 152), (158, 154), (160, 150) | 9 |

In a more general situation, each set of wafers consists of a large number of wafers. For example, one of wafer sets may have only one wafer, or only one wafer to be matched with the wafers in another wafer set. A wafer set may also have 100 or more wafers, or 1000 wafers or more, or even millions of wafers. The number of different matching schemes is thus tremendously large. For example, when a number of n wafers of one wafer set is to be matched with a number of m wafers of another wafer set, the total number of possible matching schemes is the minimum of factorials of n and m, min(n!, m!). As a result, searching for the matching scheme of the least cost among all possible matching schemes becomes a non-trivial problem. To efficiently solve this problem, a searching algorithm is provided in accordance with an embodiment of the invention, which will be discussed in the following with reference to FIG. 6.

Figure 6:
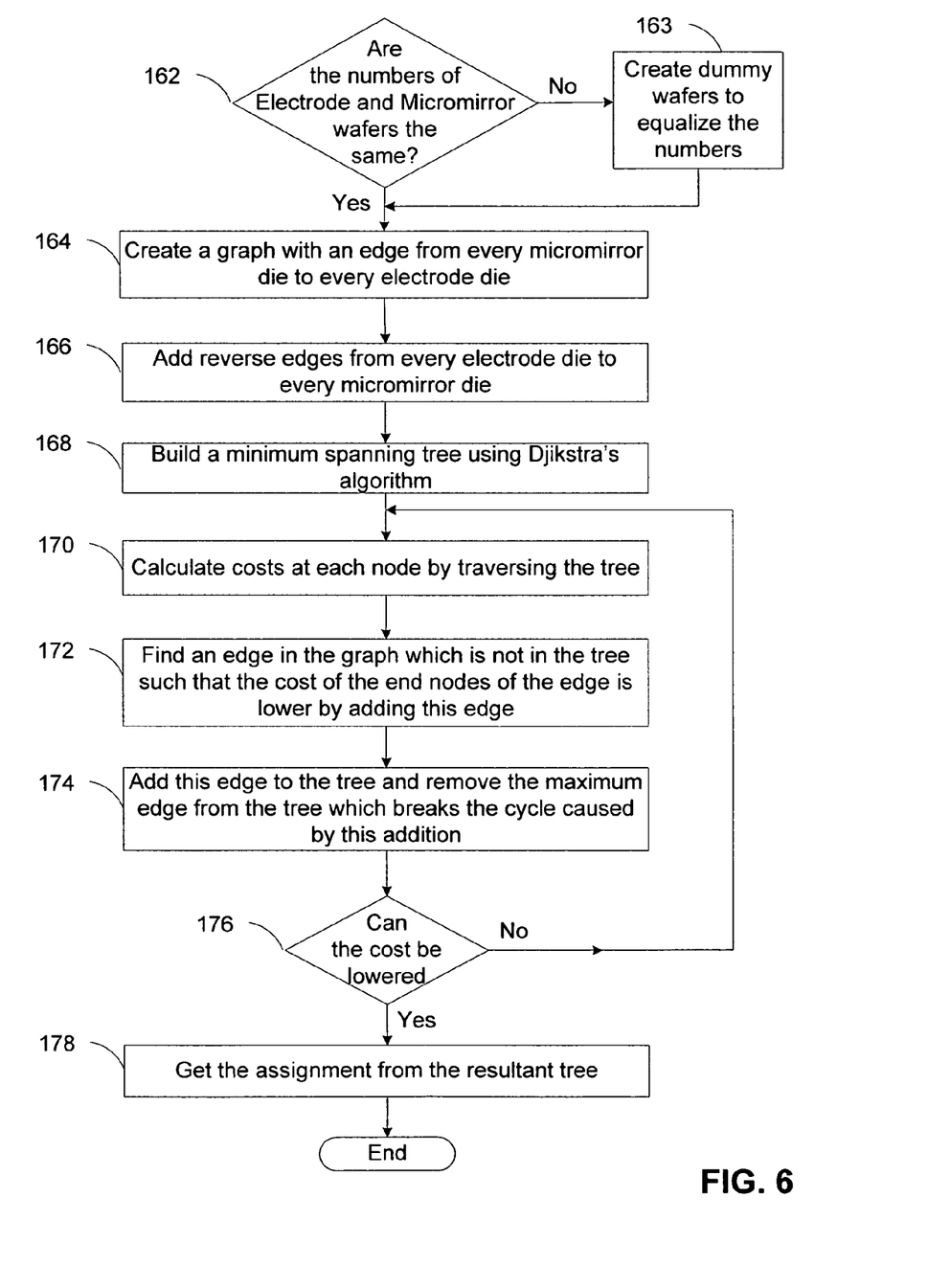
FIG. 6 is a flow chart showing the steps executed for assembling the micromirror wafer in FIG. 5b with the electrode wafers in FIG. 5a according to an embodiment of the invention.

Referring to FIG. 6, a flow chart having the steps executed for searching a matching scheme with the least cost is illustrated therein. Assuming a number of n wafers of one wafer set is to be matched with a number of m wafers of another wafer set, n and m may or may not be the same. If it is determined that n and m are not the same (step 162), dummy wafers are created to equalize the numbers of wafers to be matched (step 163). For example, if the difference between m and n is k, then a number of k dummy wafers is created and added to the wafer set of the two wafer sets whichever has less number of wafers. In calculating the cost of the die pairs and total cost of a matching scheme, the cost of a "real" wafer from a wafer set and a created dummy wafer is defined as a particular value, such as NA (not a number) or infinite to indicate that such a matching does not exist.

If the numbers of the wafers on the different sets are the same; or the same after creation of the dummy wafers, a tree graph is created. The tree graph consists of forward edges and reverse edges. Each forward edge connects a die of a first type (e.g. a micromirror die) and a die of a second type (e.g. an electrode die) and pointing from the die of the first type to the die of the second type, while a reverse edge connects the same two dies but with a reversed direction, such as pointing from the electrode die to the micromirror die (steps 164 and 166). According to the created tree graph, a minimum spanning tree is built using Djikstra's algorithm (step 168). The Djikstra's algorithm (named after its discover, E. W. Djikstra) solves the problem of finding the shortest path from a point in a graph (the source) to a destination. It turns out that one can find the shortest paths from a given source to all points in a graph in the same time. An exemplary Djikstra's algorithm is set forth in Appendix A of the present application. In fact, other variations of the Djikstra's algorithm, or similar versions, and in particular the Bellman algorithm or the Floyd algorithm are also applicable.

The cost at each node of the spanning tree is then calculated, and the calculations are performed in a traversing direction from the twigs towards the root of the spanning tree (step 170). Given the calculated costs of the nodes in the spanning tree, an edge in the tree graph is searched, wherein such edge does not appear in the spanning tree, and the cost of an end of such edge can be lowered by adding such edge in the spanning tree (step 172). Such edge is then added to the spanning tree, and the edge having the maximum cost in the spanning tree is removed which breaks the cycle resulted from the addition (step 174). After the operation on the spanning tree in step 174, it is determined whether the cost can be lowered at step 176. If not, the matching scheme is determined according to the resultant spanning tree (step 178). Otherwise, the searching procedure loops back to step 170, wherein the cost of each node of the spanning tree is calculated.

With the matching scheme resulted from the above searching procedure, the wafers are then assembled. Such assembling results in the maximized production yield. The assembled wafers can then be broken into assembled dies. The passing assembled dies may receive further processes before becoming a micromirror device, such as a spatial light modulator. The spatial light modulator has many applications, one of which is in display systems.

Figure 7:
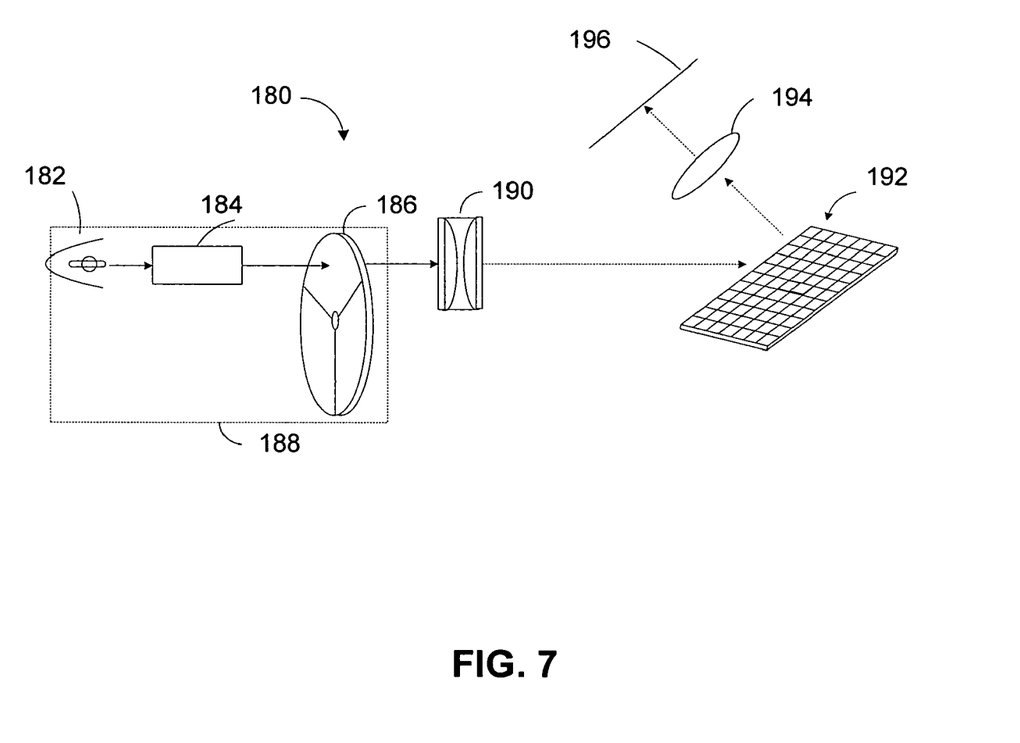
FIG. 7 demonstratively illustrates a simplified display system employing a spatial light modulator having a micromirror array assembly from the present invention.

Referring to FIG. 7, an exemplary display system is illustrated. In its basic configuration, display system 180 comprises illumination system 188 for producing sequential colour light, light modulator 192, projection lens 194, and display target 196. Other optics, such as condensing lens 190 could also be installed if desired. Illumination system 188 comprises light source 182, which can be an arc lamp, lightpipe 184 that can be any suitable integrator of light or light beam shape changer, and colour filter 186, which can be a colour wheel.

As discussed above, the matching scheme requires the location information of the non-passing and passing dies on each wafer. Qualities of the dies can be evaluated in many ways. For example, the quality, such as the uniformity of the micromirrors can be evaluated through measurements of the distribution of the resonance frequencies of the mirror plates of the micromirrors. Specifically, an illumination light beam is directed to the mirror plates of the micromirrors being inspected and a driving voltage having an AC component is applied to the mirror plates such that the mirror plates oscillate in the vicinity of their equilibrium positions. By sweeping the frequency of the AC component and dynamically observing the intensity of the reflected light from the mirror plates, the resonance frequencies of the micromirrors are obtained. By repeating the same procedure, the resonance frequencies of the micromirrors across the wafer can be obtained. From the distribution of the obtained resonance frequencies of the micromirrors being inspected, the uniformity of the micromirrors can be evaluated, as set forth in U.S. patent application Ser. No. 10/875,555 "A Method and Apparatus for Characterizing Microelectromechanical Devices on Wafers", to Simonian et al, filed along with this patent application, the subject matter being incorporated herein by reference.

As another way of example of inspecting qualities of the micromirror dies, an illumination light beam is directed onto the mirror plate of the micromirrors being inspected; and a voltage signal is applied to the mirror plate such that the mirror plate rotates from one position to another. The rotation positions of the mirror plate are dynamically measured by measuring the intensity of the reflected light from the mirror plate. Form the measured positions and the applied voltages, mechanical responses of the mirror plate to the applied voltages can be extracted. Based on such extracted information on mechanical responses, quality, such as the uniformity of the micromirrors can be evaluated, as set forth in U.S. patent application Ser. No. 10/875,760 "Performance Analyses of Microelectromechanical Devices" filed along with current patent application, the subject matter being incorporated herein by reference. In addition, the performance and product quality evaluation can be performed in other ways, one of which is measuring the electric properties, such as conductivity/resistivity of the micromirrors of the micromirror device, which will be discussed in the following.

In accordance with an embodiment of the invention, the conductivity measurements can be performed before or after removal of the sacrificial materials of the micromirror array, or both such that in addition to the information yielded by one measurement alone, a comparison of the two measurements affords information about the effects of the release process on the micromirrors. Each measurement can be performed on the provided testing area(s) or directly on the micromirrors of the micromirror array. According to the invention, one or more testing areas are fabricated along with the micromirrors. The testing areas have different configurations, such as hinge with topology structures, hinge without topology structures, hinge to mirror structures, hinge only structures, and mirror comb structures.

A hinge with topology structure is a structure that mimics the actual hinge structure in a column of real micromirrors of the micromirror array, and includes the full hinge stack with all topography. A hinge without topology structure is a structure that is meant to measure the intrinsic electrical properties of the hinge stack and pattern without taking into account the topology of the hinge. Such structure is similar to the hinge with topology structure except that alternative conductive pathways are provided to avoid measuring a hinge that crosses a mirror trench, deep, or shallow via. A hinge to mirror is designed to measure the contact between the hinge and mirror plate of the micromirror. This can yield useful information about mirror material stacks, shallow via etch, hinge deposition, and etch, and removal of sacrificial materials. The hinge to mirror structure consists of isolated mirror squares bridged by hinges with shallow vias at each end. If one shallow via fails electrically the entire structure will become an open circuit. A hinge only structure is the same as hinge with topology structure with the hinge supporting components removed. This isolates the hinge and removes the parallel conductive element. A mirror comb is designed to be an open circuit if the mirror stack is behaving as expected. The mirror comb consists of two regions of mirror stack material, including sidewall spacer, separated by a long gap equal in width to the mirror spacing in the main array.

The conductivity is measured on each of the provided testing areas. According to the measured conductivity, the quality and performance of the micromirror array device are evaluated. As a way of example, assuming five testing areas of different configurations are fabricated on each micromirror array die, the conductivity measurement can be performed on the testing areas of the same configuration but on different dies on a wafer. For example, the conductivity can be measured on the hinge with topology structures on all dies of a micromirror wafer. Specifically, the conductivity of each hinge with topology structure of a die can be measured through a standard I-V curve. If the I-V curve follows the ohm's law, a valid measured conductivity is extracted from the I-V curve, such as conductivity=dI/dV. Otherwise, the measured conductivity is not valid, and the micromirror array associated with the measured hinge with topology structure may be "bad."

The measured valid conductivities are then analyzed so as to obtain the uniformity information of the micromirrors across the wafer. Specifically, variation of the measured valid conductivities is calculated. If the variation is within a predetermined range, it is believed that the dies on wafer may be uniform from the view point of the electrical property. Otherwise, the micromirror array dies on the wafer are not uniform. The measured conductivity can also be used to identify the non-passing and "good" dies. In particular, if the measured conductivity is not valid, the die may be a non-passing die. If the measured conductivity is valid, but beyond the predefined conductivity variation range, the die may be a non-passing die.

It will be appreciated by those of skill in the art that a new and useful method and a system for assembling micromirror array dies on the wafer level have been described herein. In view of the many possible embodiments to which the principles of this invention may be applied, however, it should be recognized that the embodiments described herein with respect to the drawing figures are meant to be illustrative only and should not be taken as limiting the scope of invention. Those of skill in the art will recognize that the illustrated embodiments can be modified in arrangement and detail without departing from the spirit of the invention. For example, those skilled in the art will appreciate that any of a wide variety of quality inspection and analyses procedures could be used individually or in combination, as well as a variety of matching algorithms and techniques, in order to cost-effectively match the two types of wafers together. Therefore, the invention as described herein contemplates such embodiments as may come within the scope of the following claims and equivalents thereof.

We claim:

1. A method of forming a plurality of microelectromechanical devices, comprising:
    providing a first and second sets of wafers, each wafer having a component of the microelectromechanical device, and each set having one or more wafers;
    adding an identification information to each wafer for uniquely identifying the wafer;
    storing the identification information into a database;
    inspecting the quality of each wafer from the first and second set of wafers and determining passing and not-passing dies on each wafer based on the inspection; and
    matching a wafer from the first set of wafers with a wafer in the second wafer set based on the determined passing and not-passing dies on each wafer.

2. The method of claim 1, further comprising:
    forming a plurality of elcetrodes and circuitry on the wafers in the first wafer set; and
    forming a plurality of micromirrors on the wafers in the second set.

3. The method of claim 2, wherein the electrodes and circuitry are formed into electrode dies on the wafers; and wherein the micromirrors are formed into micromirror dies on the wafers.

4. The method of claim 3, wherein the identification information is a bar code.

5. The method of claim 2, wherein the step of inspecting the wafer further comprises:
    inspecting the quality of each micromirror and electrode die; and
    identifying a location of each passing and non-passing micromirror die and a location of each passing and non-passing electrode die according to the inspection and a predetermined quality threshold.

6. The method of claim 2, wherein step of matching the wafer from the first wafer set to the wafer from the second wafer set further comprises:
    selecting a plurality of matching schemes;
    calculating a cost for each selected matching scheme, wherein the cost is defined as a total number of unmatched die assemblies resulted from said each matching scheme with the unmatched die assembly being an assembly consisting of a passing and non-passing die; and
    determining a matching scheme from the selected matching schemes such that the calculated cost is the minimum among the calculated costs of the selected matching schemes.

7. The method of claim 6, wherein the selected matching schemes include all possible pairs of a wafer from the first wafer set and a wafer from the second wafer set.

8. The method of claim 6, wherein the step of calculating the cost for each selected matching scheme further comprises:
    determining whether the total number wafers to be matched in the first set is equal to the total number of wafers to be matched in the second wafer set;
    if said numbers are not equal, creating a number of dummy wafers to equalize the numbers; and
    defining the cost of a die pair having a dummy die to be infinite.

9. The method of claim 8, wherein the step of determining a matching scheme further comprises:
    determining the matching scheme using a Djikstra's algorithm.

10. The method of claim 5, wherein each micromirror dies comprises an array of reflective deflectable micromirrors, and the micromirror array comprises 1024×768 micromirrors or more, or 1280×1200 or more, or 1600×1200 or more micromirrors.

11. The method of claim 5, wherein each micromirror comprises a deflectable reflective mirror plate and a deformable hinge formed on a substrate, wherein the mirror plate is attached to the hinge such that the mirror plate is operable to rotate on the substrate.

12. The method of claim 11, wherein the substrate is light transmissive.

13. The method of claim 12, wherein the substrate is glass.

14. The method of claim 11, wherein the mirror plate and the hinge of each micromirror are in different planes parallel to the substrate.

15. The method of claim 11, wherein a center-to-center distance between adjacent micromirrors in the micromirror array is 25 microns or less.

16. The method of claim 11, wherein the center-to-center distance between the adjacent micromirrors is 10 microns or less.

17. The method of claim 11, wherein the center-to-center distance between the adjacent micromirrors is 0.5 microns or less.

18. The method of claim 11, wherein the mirror place of the micromirror is 20 microns or less.

19. The method of claim 11, wherein the "good" and non-passing micromirror dies are randomly distributed across a wafer.

20. The method of claim 11, wherein the passing and non-passing electrode dies are randomly distributed across the wafer.

21. The method of claim 11, wherein the passing micromirror dies are located in an interior region of the wafer, while the non-passing micromirror dies are located around the peripheral of the wafer.

22. The method of claim 11, wherein the step of inspecting the micromirror dies further comprises:
    measuring a resonance frequency of one or more micromirrors in the micromirror die;
    obtaining a distribution of the measured resonance frequencies of the micromirrors across the wafer; and
    evaluating an uniformity of the micromirrors in the micromirror die based on the obtained distribution of the resonance frequencies.

23. The method of claim 22, wherein the step of measuring the frequency further comprises;
    applying a driving voltage having an AC component to the mirror plates of the micromirrors being inspected such that the mirror plates oscillate in the vicinity of their equilibrium positions.

24. The method of claim 11, wherein the step of inspecting the micromirror dies further comprising:
directing an illumination light onto the mirror plate;
applying a voltage signal to a mirror plate such that the mirror plate rotates from one position to another;
dynamically detecting the rotation positions of the mirror plate by measuring an intensity of the reflected light from the mirror plate; and
extracting a parameter from the dynamically detected rotational positions, wherein the parameter characterizes the electromechanical responses of the micromirror.

25. The method of claim 1, wherein one of the first and second wafer sets has a single wafer.

26. The method of claim 1, wherein one of the first and second wafer sets has a plurality of wafers.

27. The method of claim 1, wherein one of the first and second wafer sets has 100 or more wafers.

28. The method of claim 1, wherein one of the first and second wafer sets has 1000 or more wafers.

* * * * *